(12) United States Patent
Huang et al.

(10) Patent No.: US 8,949,758 B1
(45) Date of Patent: Feb. 3, 2015

(54) HYBRID DESIGN RULE FOR DOUBLE PATTERNING

(71) Applicant: Taiwan Semiconductor Manufacturing Company Limited, Hsin-Chu (TW)

(72) Inventors: Cheng-I Huang, Hsinchu (TW); Wen-Hao Chen, Hsinchu (TW); Wen-Chun Huang, Tainan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/063,496

(22) Filed: Oct. 25, 2013

Related U.S. Application Data

(60) Provisional application No. 61/862,324, filed on Aug. 5, 2013.

(51) Int. Cl.
*G06F 17/50* (2006.01)

(52) U.S. Cl.
CPC .................................. *G06F 17/5081* (2013.01)
USPC ............................................ 716/113; 716/52

(58) Field of Classification Search
CPC ............ G06F 17/5081; G06F 17/5068; G06F 17/5036; G06F 17/5022; G06F 17/5077
USPC ...................................................... 716/52, 112
See application file for complete search history.

(56) References Cited

U.S. PATENT DOCUMENTS

| 6,080,993 | A  | * | 6/2000 | Zwijsen | .......................... | 250/548 |
| 2013/0298089 | A1 | * | 11/2013 | Yuan et al. | ...................... | 716/52 |

* cited by examiner

*Primary Examiner* — Vuthe Siek

(74) *Attorney, Agent, or Firm* — Cooper Legal Group, LLC

(57) ABSTRACT

Among other things, one or more systems and techniques for generating or implementing a hybrid design rule set are provide herein. A set of color design rules and a set of color agnostic design rules are generated and exposed for selective design rule assignment. In an embodiment, a first color design rule is assigned to a first polygon. In an embodiment, a first color agnostic design rule is assigned to a second polygon. In this way, color design rules and color agnostic design rules are selectively applied to polygons of a design layout. Color design rules are selected for space and design efficiency. Color agnostic rules are selected for conservative design layout for design ease. A design rule checking stage and a design rule fixing stage are performed such that the design layout is compliant after color decomposition without a second design rule fixing stage.

20 Claims, 8 Drawing Sheets

400

402

404

HYBRID DESIGN RULE FOR DOUBLE PATTERNING

BACKGROUND

Electronic design tools allow designers to layout, simulate, and analyze electrical components, such as integrated circuits. In an example, a schematic designer creates a schematic diagram of an integrated circuit. The schematic diagram comprises symbols that represent components of the integrated circuit. However, the schematic diagram does not represent a physical layout of the integrated circuit. A layout designer creates a physical layout of the integrated circuit using the schematic diagram. The physical layout comprises one or more polygons representing metal, silicon, or other components or portions thereof. The physical layout is decomposed where polygons are colored or assigned to one or more masks. In double patterning, a first mask is used to form a first set of polygons, and a second mask is used to form a second set of polygons. Using multiple masks allow the layout designer to form polygons according to stricter design layout rules, such as width or spacing rules, thus promoting efficiency.

DETAILED DESCRIPTION

Figure 1:
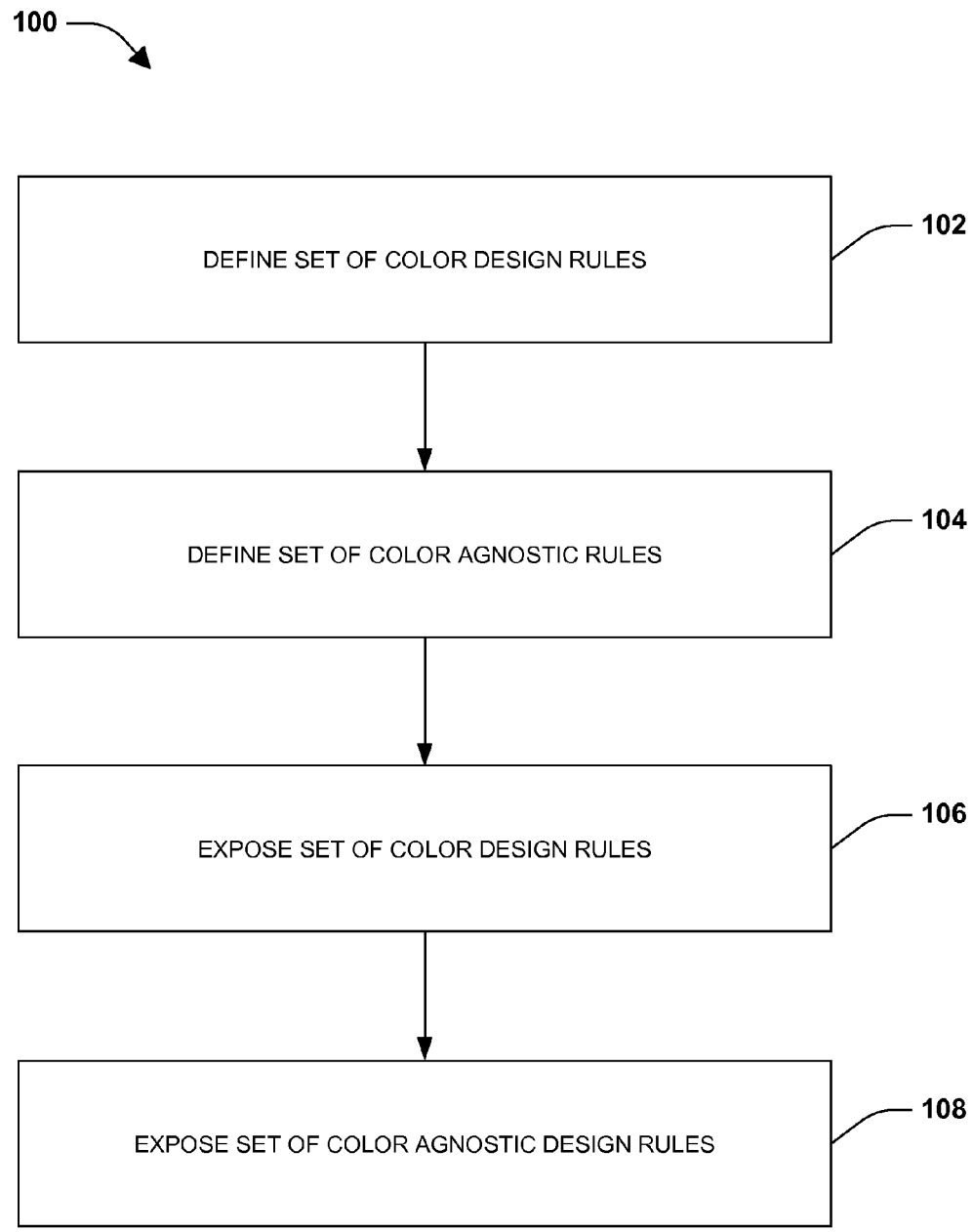
FIG. 1 is a flow diagram illustrating a method of hybrid design rule generation, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

Figure 5:
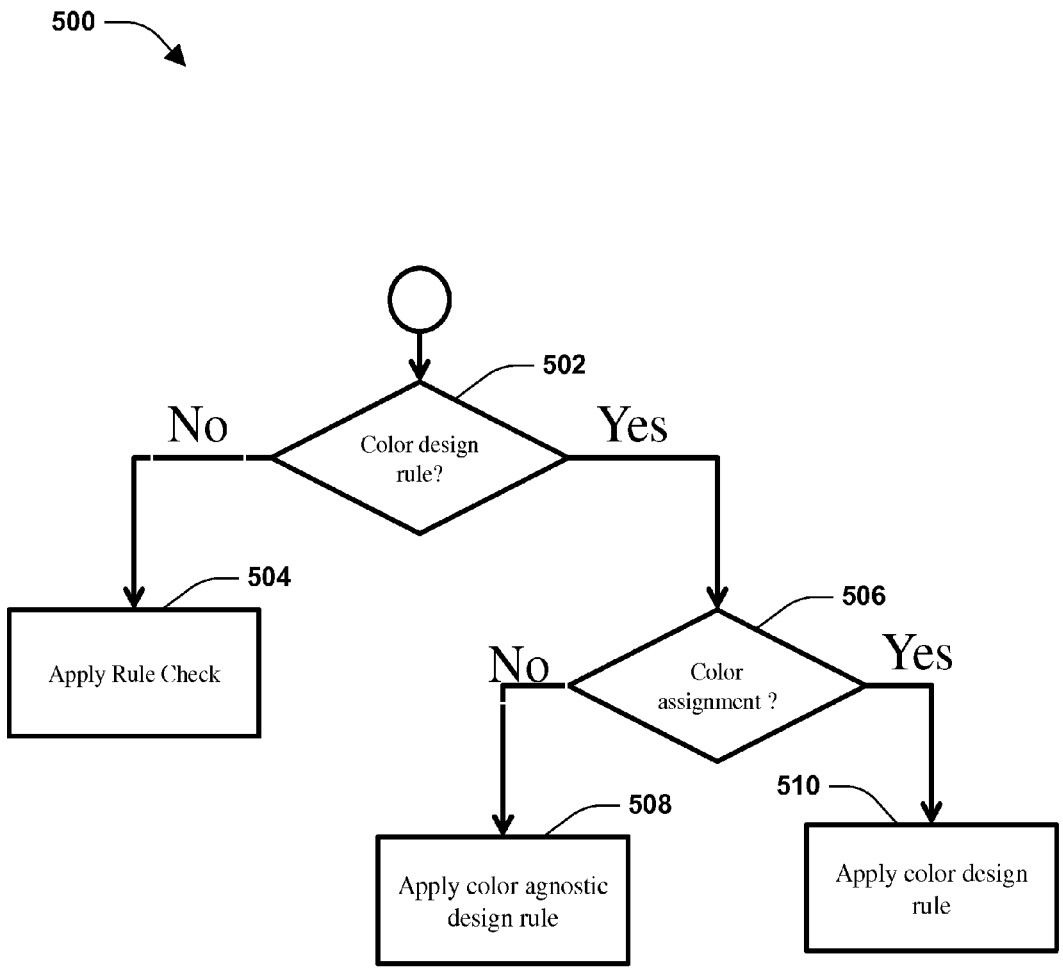
FIG. 5 is an illustration of a design rule checking stage, according to some embodiments.
Figure 6:
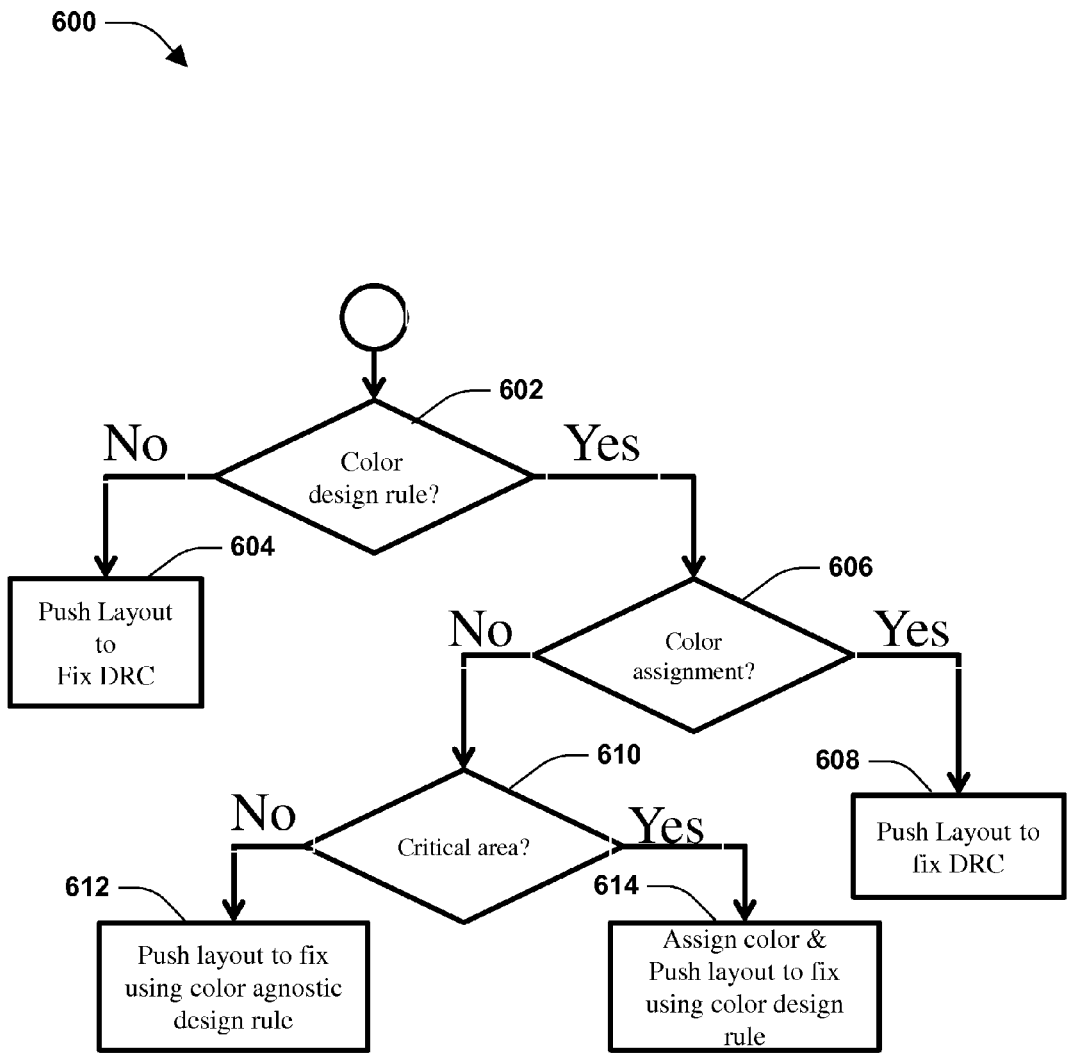
FIG. 6 is an illustration of a design rule fixer stage, according to some embodiments.

A method 100 of hybrid design rule generation is illustrated in FIG. 1. At 102, a set of color design rules are defined for design layout compliance of a design layout for an integrated circuit. At 104, the set of color agnostic rules are exposed for selective association with one or more polygons within the design layout. At 106, a set of color agnostic design rules are defined for design layout compliance of the design layout. At 108, the set of color agnostic design rules are exposed to selective association with one or more polygons within the design layout. In this way, a designer can selective assign color agnostic design rules or color design rules to polygons within the design layout. In an embodiment, a first color design rule is assigned to a first polygon and a first color agnostic design rule is assigned to a second polygon. The first color design rule specifies a first design constraint comprising a first limitation value that is less restrictive than a second limitation value of a second design constraint specified by the first color agnostic design rule. In an embodiment, a design checker stage 500 is performed to determine whether the design layout is compliant with design rules assigned to polygons within the design layout, as illustrated in FIG. 5. In an embodiment, responsive to identification of a design rule violation, a design fixer stage 600 is performed to modify the design layout for compliance, as illustrated in FIG. 6.

It is appreciated that a color is associated with a mask. In an embodiment, a first color is associated with a first mask such that one or more polygons assigned the first color will be formed by the first mask. A second color is associated with a second mask such that one or more polygons assigned to the second color will be formed by the second mask.

Figure 2:
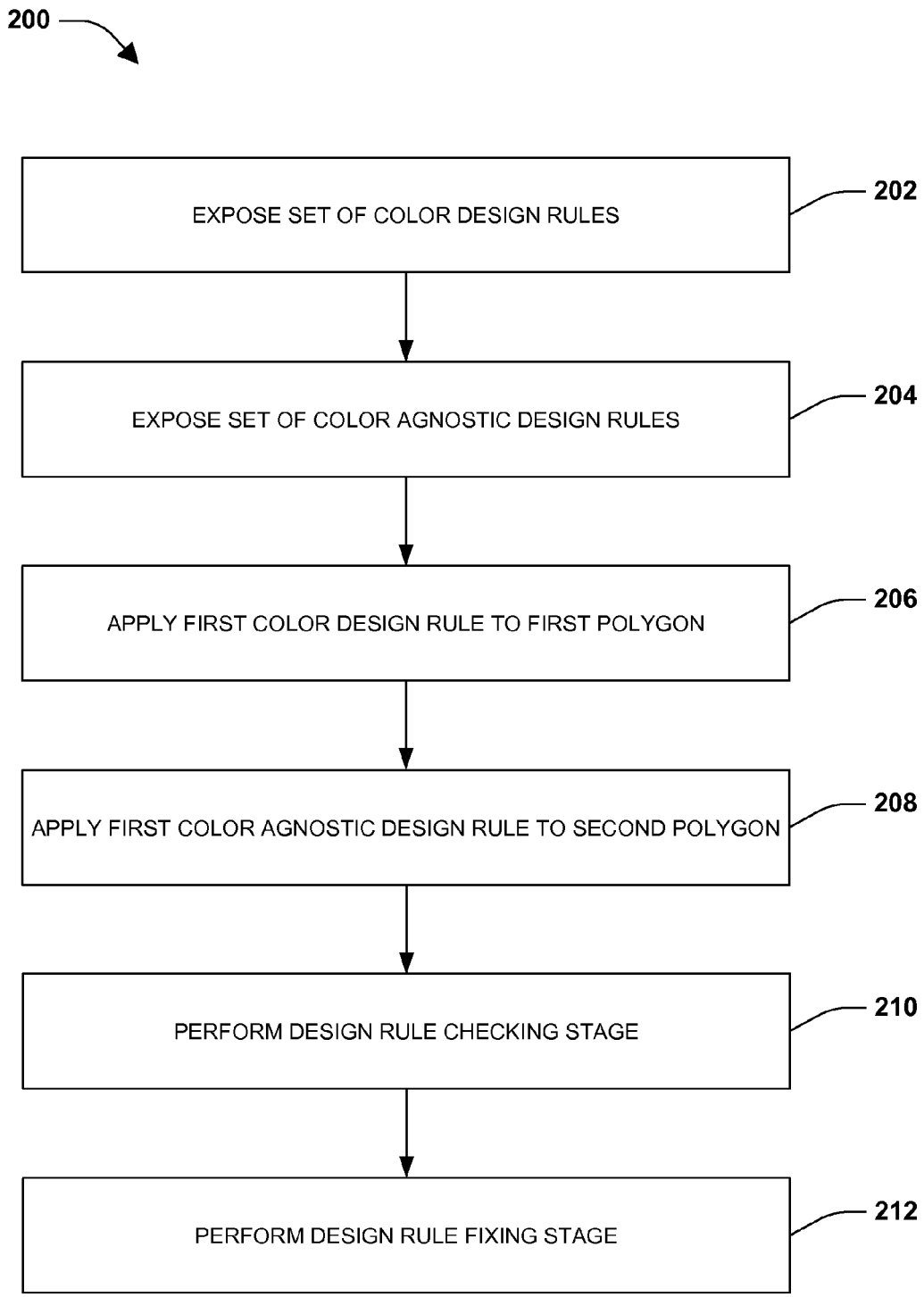
FIG. 2 is a flow diagram illustrating a method of implementing a hybrid design rule set, according to some embodiments.

A method 200 of implementing a hybrid design rule set is illustrated in FIG. 2. At 202, a set of color design rules are exposed for selective association with one or more polygons within a design layout of an integrated circuit. At 204, a set of color agnostic design rules are exposed for selective association with one or more polygons within the design layout. At 206, responsive to selection of a first color design rule for a first polygon, applying the first color design rule to the first polygon. At 208, responsive to selection of a first color agnostic design rule for a second polygon, applying the first color agnostic design rule to the second polygon. At 210, a design rule checking stage is performed to determine whether at least one polygon within the design layout violates a design rule, such as the first color design rule or the first color agnostic design rule. At 212, responsive to identification of a design rule layout violation of a polygon, a design rule fixing stage is performed to modify a layout of the polygon for design rule compliance.

Figure 3:
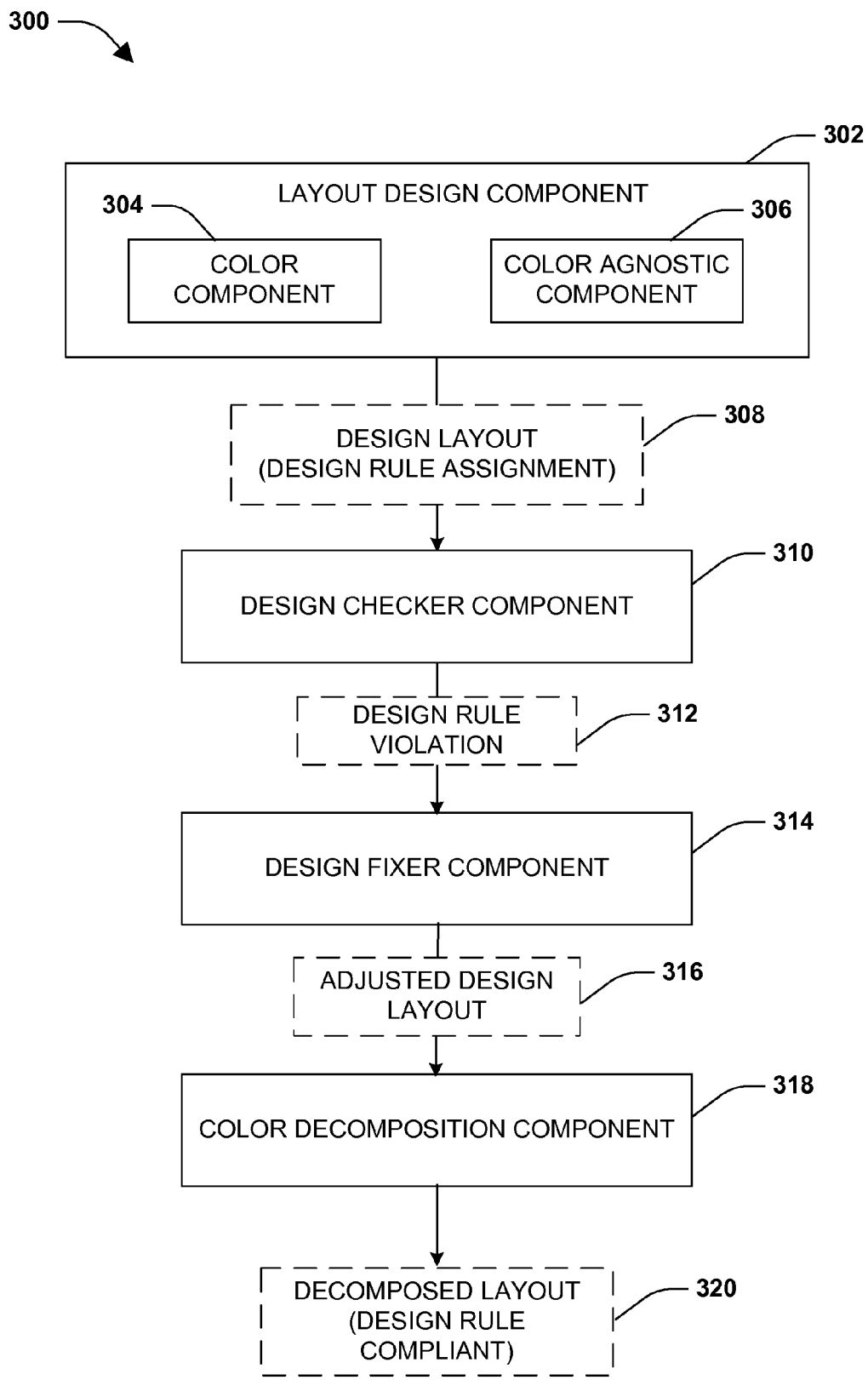
FIG. 3 is an illustration of a system for hybrid design rule generation, according to some embodiments.

FIG. 3 illustrates a system 300 for hybrid design rule generation. The system 300 comprises at least one of a layout design component 302, a color component 304, a color agnostic component 306, a design checker component 310, a design fixer component 314, or a color decomposition component 318. The layout design component 302 is configured to facilitate layout of a design layout for an integrated circuit. The color component 304 is configured to define and expose a set of color design rules. The color agnostic component 306 is configured to define and expose a set of color agnostic design rules. Color agnostic design rules and color design rules are selectively assignment to one or more polygons within the design layout to create a design layout 308 having design rule assignments.

The design checker component 310 is configured to determine whether the design layout 308 complies with the design rules assignments. In embodiment, the design checker component 310 determines a design rule violation 312. The design fixer component 314 is configured to adjust the design layout 308 for design layout compliance to create an adjusted design layout 316. In an embodiment, the design fixer component 314 modifies a color assignment for a polygon, modifies a position of the polygon, or modifies a size of the polygon. The color decomposition component 318 is configured perform a color decomposition stage to decompose the adjusted design layout 316 or the design layout 308 where there is no design rule violation to create a decomposed layout 320. The decomposed layout 320 is declared as design rule compliant without performing a second design rule fixing stage after the color decomposition stage.

Figure 4:
FIG. 4 is an illustration of a color design rule and a color agnostic design rule, according to some embodiments.
Figure 4:

FIG. 4 illustrates a color design rule 402 and a color agnostic design rule 404. The color design rule 402 specifies a first design constraint min spacing comprising a first limitation value of 5 spacing units or more. The color agnostic design rule 404 specifies a second design constraint min spacing comprising a second limitation value of 10 spacing unites or more that is more restrictive than the first limitation value. A design can selectively apply the color design rule 402 to a polygon for design and spacing efficiency or can selectively apply the color agnostic design rule 404 for design ease.

FIG. 5 illustrates a design checker stage 500. At 502, a determination is made as to whether a color design rule is assigned to a polygon of a design layout. If no color design rule is assigned to the polygon, then a rule check is applied, at 504. If a color design rule is assigned and the polygon does not have a color assignment, then a color agnostic design rule is applied, at 508. If a design rule is assigned and the polygon has a color assignment, then a color design rule is applied. In this way, a design rule violation, such as of the color agnostic design rule or the color design rule, is identifiable.

FIG. 6 illustrates a design fixer stage 600. The design fixer stage 600 is performed where a design rule violation is detected. At 602, a determination is made as to whether a color design rule is assigned to a polygon of a design layout. If no color design rule is assigned to the polygon at 602, then the design layout is pushed out to a design fixer component for design rule compliance fixing, at 604. If a color design rule is assigned at 602 and the polygon has a color assignment at 606, then the design layout is pushed out to the design fixer component for design rule compliance fixing, at 608. If a color design rule is assigned at 602, the polygon does not have a color assignment at 606, and the polygon is not associated with a critical area at 610, then the design layout is pushed out to the design fixer component for design rule compliance fixing using a color agnostic design rule, at 612. If a color design rule is assigned at 602, the polygon does not have a color assignment at 606, and the polygon is associated with a critical area at 610, then a color is assigned to the polygon and the design layout is pushed out to the design fixer component for design rule compliance fixing using a color design rule, at 614.

Figure 7:
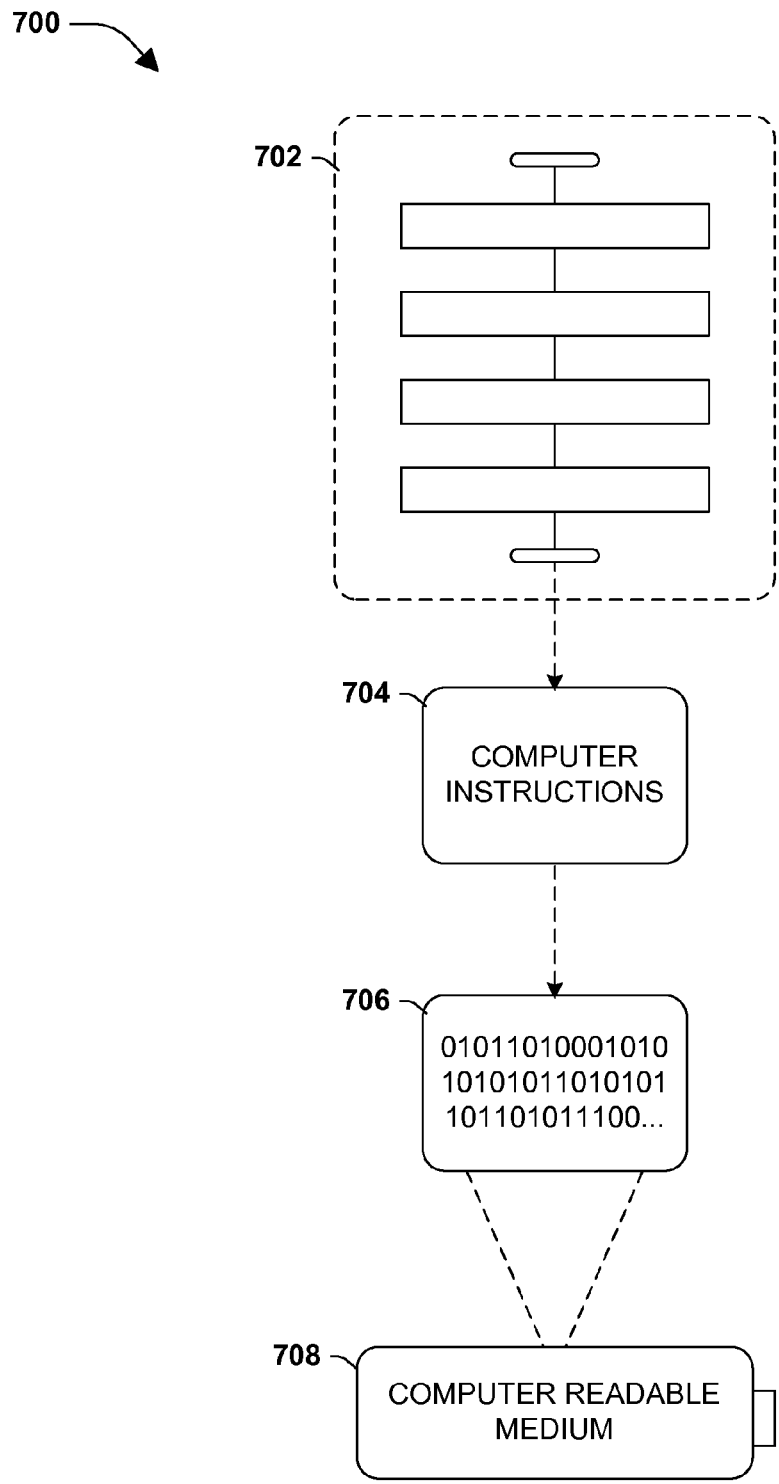
FIG. 7 is an illustration of an example computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An exemplary computer-readable medium is illustrated in FIG. 7, wherein the implementation 700 comprises a computer-readable medium 708 (e.g., a CD-R, DVD-R, flash drive, a platter of a hard disk drive, etc.), on which is encoded computer-readable data 706. This computer-readable data 706 in turn comprises a set of computer instructions 704 configured to operate according to one or more of the principles set forth herein. In one such embodiment 700, the processor-executable computer instructions 704 may be configured to perform a method 702, such as at least some of the exemplary method 100 of FIG. 1 and/or at least some of the exemplary method 200 of FIG. 2, for example. In another such embodiment, the processor-executable instructions 712 may be configured to implement a system, such as at least some of the exemplary system 300 of FIG. 3, for example. Many such computer-readable media may be devised by those of ordinary skill in the art that are configured to operate in accordance with the techniques presented herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some the claims.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 8:
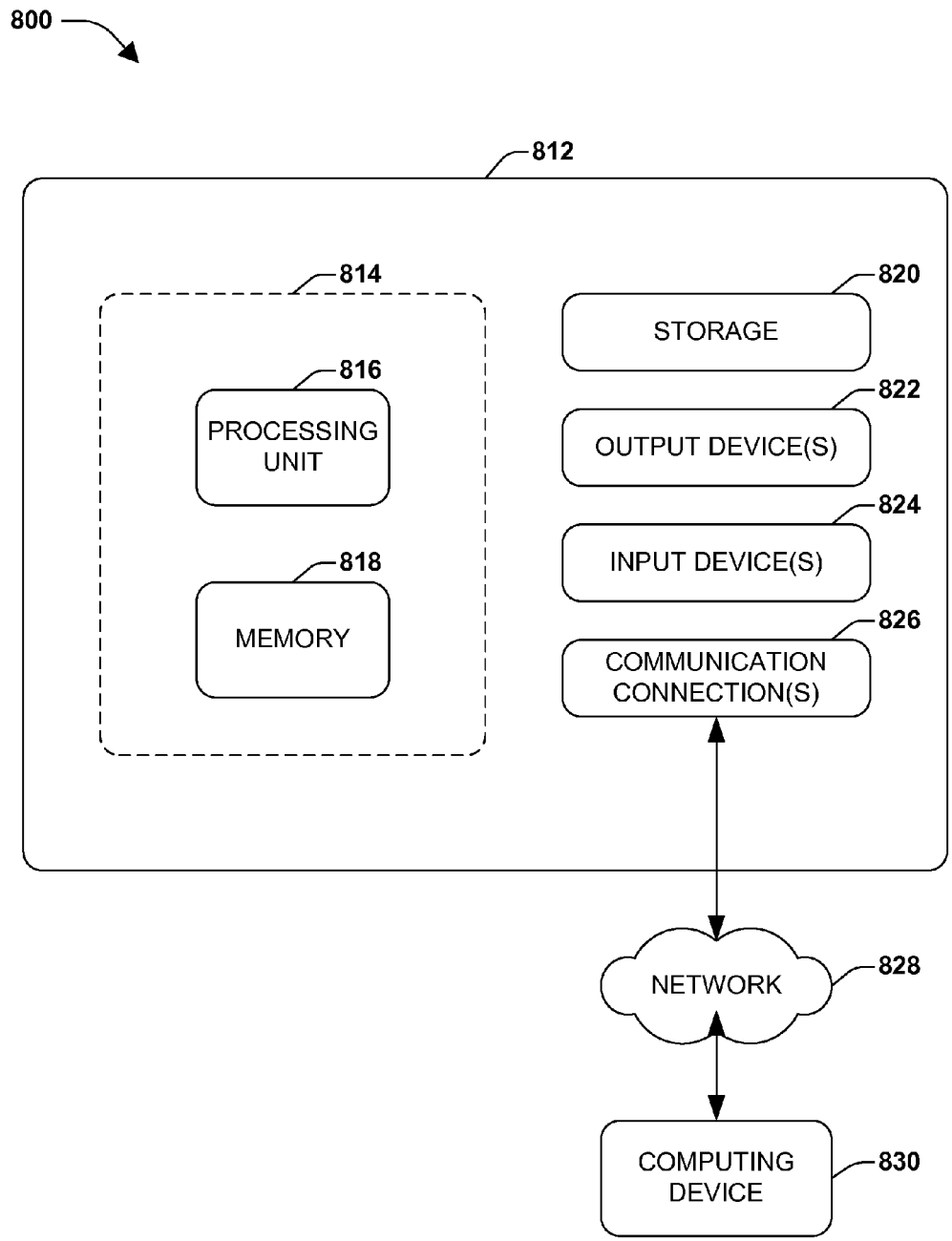
FIG. 8 illustrates an example computing environment wherein one or more of the provisions set forth herein may be implemented.

FIG. 8 and the following discussion provide a brief, general description of a suitable computing environment to implement embodiments of one or more of the provisions set forth herein. The operating environment of FIG. 8 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 8 illustrates an example of a system 800 comprising a computing device 812 configured to implement one or more embodiments provided herein. In one configuration, computing device 812 includes at least one processing unit 816 and memory 818. Depending on the exact configuration and type of computing device, memory 818 may be volatile (such as RAM, for example), non-volatile (such as ROM, flash memory, etc., for example) or some combination of the two. This configuration is illustrated in FIG. 8 by dashed line 814.

In other embodiments, device 812 may include additional features and/or functionality. For example, device 812 may also include additional storage (e.g., removable and/or non-removable) including, but not limited to, magnetic storage, optical storage, and the like. Such additional storage is illustrated in FIG. 8 by storage 820. In some embodiments, computer readable instructions to implement one or more embodiments provided herein may be in storage 820. Storage 820 may also store other computer readable instructions to implement an operating system, an application program, and the like. Computer readable instructions may be loaded in memory 818 for execution by processing unit 816, for example.

The term "computer readable media" as used herein includes computer storage media. Computer storage media includes volatile and nonvolatile, removable and non-removable media implemented in any method or technology for storage of information such as computer readable instructions or other data. Memory 818 and storage 820 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 812. Any such computer storage media may be part of device 812.

Device 812 may also include communication connection(s) 826 that allows device 812 to communicate with other devices. Communication connection(s) 826 may include, but is not limited to, a modem, a Network Interface Card (NIC), an integrated network interface, a radio frequency transmitter/receiver, an infrared port, a USB connection, or other interfaces for connecting computing device 812 to other computing devices. Communication connection(s) 826 may include a wired connection or a wireless connection. Communication connection(s) 826 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 812 may include input device(s) 824 such as keyboard, mouse, pen, voice input device, touch input device, infrared cameras, video input devices, and/or any other input device. Output device(s) 822 such as one or more displays, speakers, printers, and/or any other output device may also be included in device 812. Input device(s) 824 and output device(s) 822 may be connected to device 812 via a wired connection, wireless connection, or any combination thereof. In some embodiments, an input device or an output device from another computing device may be used as input device(s) 824 or output device(s) 822 for computing device 812.

Components of computing device 812 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In another embodiment, components of computing device 812 may be interconnected by a network. For example, memory 818 may be comprised of multiple physical memory units located in different physical locations interconnected by a network.

Those skilled in the art will realize that storage devices utilized to store computer readable instructions may be distributed across a network. For example, a computing device 830 accessible via a network 828 may store computer readable instructions to implement one or more embodiments provided herein. Computing device 812 may access computing device 830 and download a part or all of the computer readable instructions for execution. Alternatively, computing device 812 may download pieces of the computer readable instructions, as needed, or some instructions may be executed at computing device 812 and some at computing device 830.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to an aspect of the instant disclosure, a system for hybrid design rule generation is provided. The system comprises a color component and a color agnostic component. The color component is configured to define a set of color design rules for design layout compliance of a design layout for an integrated circuit. The color component is configured to expose the set of color design rules for selective association with one or more polygons within the design layout. The color agnostic component is configured to define a set of color agnostic design rules for design layout compliance of the design layout. The color agnostic component is configured to expose the set of color agnostic design rules for selective association with one or more polygons within the design layout.

According to an aspect of the instant disclosure, a method for hybrid design rule generation is provided. The method comprises defining a set of color design rules for design layout compliance of a design layout for an integrated circuit. The set of color design rules are exposed for selective association with one or more polygons within the design layout. A set of color agnostic design rules for design layout compliance of the design layout are generated. The set of color agnostic design rules are exposed for selective association with one or more polygons within the design layout.

According to an aspect of the instant disclosure, a method for implementing a hybrid design rule set is provided. The method comprises exposing a set of color design rules for selective association with one or more polygons within a design layout of an integrated circuit. A set of color agnostic design rules are exposed for selective association with one or more polygons within the design layout. Responsive to selection of a first color design rule for a first polygon, the first color design rule is applied to the first polygon. Responsive to selection of a first color agnostic design rule for a first second, the first color agnostic design rule is applied to the second polygon. A design rule checking stage is performed to determine whether at least one polygon within the design layout violates a design rule. Responsive to identification of a design rule layout violation of a polygon, a design rule fixing stage is performed to modify a layout of the polygon for design rule compliance.

What is claimed is:

1. A system for hybrid design rule generation, comprising:
   a color component configured to:
      define a set of color design rules for design layout compliance of a design layout for an integrated circuit, the set of color design rules applicable to one or more colored polygons within the design layout;
   a color agnostic component configured to:
      define a set of color agnostic design rules for design layout compliance of the design layout, the set of color agnostic design rules applicable to one or more non-colored polygons within the design layout; and
   a design checker component configured to:
      determine whether a first polygon of the design layout is colored;
      apply a first color design rule of the set of color design rules to the first polygon when the first polygon is colored; and
      apply a first color agnostic design rule of the set of color agnostic design rules to the first polygon when the first polygon is not colored.

2. The system of claim 1, wherein the first polygon is colored when the first polygon has a mask assignment to a mask.

3. The system of claim 1, wherein the first polygon is not colored when the first polygon has no mask assignment.

4. The system of claim 1, the design layout comprising a second polygon and the design checker component configured to:
   determine whether the second polygon is colored;
   apply a second color design rule of the set of color design rules to the second polygon when the second polygon is colored, the second color design rule different than the first color design rule; and
   applying a second color agnostic design rule of the set of color agnostic design rules to the second polygon when the second polygon is not colored, the second color agnostic design rule different than the first color agnostic design rule.

5. The system of claim 1, the first color design rule specifying a first design constraint.

6. The system of claim 5, the first design constraint comprising a first limitation value that is less restrictive than a second limitation value of a second design constraint specified by the first color agnostic design rule.

7. The system of claim 1, the design checker component configured to:
   not apply the first color agnostic design rule to the first polygon when the first polygon is colored.

8. The system of claim 1, the design checker component configured to:
   not apply the first color design rule to the first polygon when the first polygon is not colored.

9. The system of claim 1, wherein:
   the first polygon is colored when the first polygon has a mask assignment; and
   the first polygon is not colored when the first polygon has no mask assignment.

10. The system of claim 1, the design checker component configured to:
    identify a design rule violation associated with the first polygon based upon at least one of the first color design rule or the first color agnostic design rule.

11. The system of claim 10, comprising:
    a design fixer component configured to:
       fix a layout of the first polygon responsive to identifying the design rule violation.

12. The system of claim 1, the design checker component configured to:
    identify a design rule violation associated with the first polygon based upon the first color agnostic design rule.

13. The system of claim 12, comprising:
    a design fixer component configured to:
       assign a color to the first polygon responsive to identifying the design rule violation, and wherein:
       the design checker component is configured to apply the first color design rule to the first polygon responsive to the design fixer component assigning the color to the first polygon.

14. A method for hybrid design rule generation, comprising:
    defining a set of color design rules for design layout compliance of a design layout for an integrated circuit, the set of color design rules applicable to one or more colored polygons within the design layout;
    defining a set of color agnostic design rules for design layout compliance of the design layout, the set of color agnostic design rules applicable to one or more non-colored polygons within the design layout; and
    performing design rule checking for a first polygon of the design layout, comprising:
       determining whether the first polygon is colored;
       applying a first color design rule of the set of color design rules to the first polygon when the first polygon is colored; and
       applying a first color agnostic design rule of the set of color agnostic design rules to the first polygon when the first polygon is not colored, at least some of the method implemented at least in part via a processing unit.

15. The method of claim 14, wherein:
    the first polygon is colored when the first polygon has a mask assignment to a mask.

16. The method of claim 14, comprising:
  identifying a design rule violation associated with the first polygon based upon at least one of the first color design rule or the first color agnostic design rule; and
  performing design rule fixing for the first polygon responsive to the identifying a design rule violation.

17. The method of claim 14, comprising:
  responsive to completion of the performing design rule checking, performing color decomposition for the design layout.

18. The method of claim 17, comprising:
  responsive to completion of the performing color decomposition, declaring the design layout as design rule compliant.

19. The method of claim 14, wherein:
  the first color design rule has a first design constraint comprising a first limitation value; and
  the first color agnostic design rule has a second design constraint comprising a second limitation value that is more restrictive than the first limitation value of the first design constraint.

20. A method for implementing a hybrid design rule set, comprising:
  exposing a set of color design rules for selective association with one or more colored polygons within a design layout of an integrated circuit;
  exposing a set of color agnostic design rules for selective association with one or more non-colored polygons within the design layout;
  performing design rule checking for a first polygon of the design layout, comprising:
    determining whether the first polygon is colored;
      applying a first color design rule of the set of color design rules to the first polygon when the first polygon is colored; and
      applying a first color agnostic design rule of the set of color agnostic design rules to the first polygon when the first polygon is not colored,
  at least some of the method implemented at least in part via a processing unit.

* * * * *